(12) United States Patent
Werner et al.

(10) Patent No.: US 10,196,562 B2
(45) Date of Patent: Feb. 5, 2019

(54) QUANTUM DOTS STABILIZED WITH A METAL THIOL POLYMER

(71) Applicants: Matthew Werner, Manchester (GB); Benjamin Peek, Manchester (GB); Abu Mohammad Imroz Ali, Manchester (GB); Shahin Salma, Manchester (GB); Steven Daniels, Manchester (GB); James Harris, Manchester (GB)

(72) Inventors: Matthew Werner, Manchester (GB); Benjamin Peek, Manchester (GB); Abu Mohammad Imroz Ali, Manchester (GB); Shahin Salma, Manchester (GB); Steven Daniels, Manchester (GB); James Harris, Manchester (GB)

(73) Assignee: Nanoco Technologies Ltd., Manchester (GB)

(*) Notice: Subject to any disclaimer, the term of this patent is extended or adjusted under 35 U.S.C. 154(b) by 169 days.

(21) Appl. No.: 15/061,753

(22) Filed: Mar. 4, 2016

(65) Prior Publication Data

US 2016/0289552 A1 Oct. 6, 2016

Related U.S. Application Data

(60) Provisional application No. 62/128,354, filed on Mar. 4, 2015.

(51) Int. Cl.
*C09K 11/02* (2006.01)
*H01L 33/56* (2010.01)
(Continued)

(52) U.S. Cl.
CPC ............ *C09K 11/025* (2013.01); *C08G 79/00* (2013.01); *C09K 11/02* (2013.01); *C09K 11/703* (2013.01);
(Continued)

(58) Field of Classification Search
CPC ................................ B82Y 20/00; C08G 79/00
See application file for complete search history.

(56) References Cited

U.S. PATENT DOCUMENTS 7,544,725 B2 6/2009 Pickett et al.
7,674,844 B2 3/2010 Pickett et al.
(Continued)

OTHER PUBLICATIONS

Su Chen et al., "Facile fabrication of superhydrophobic surface from micro/nanostructure metal alkanethiolate based films", Chemical Communications—CHEMCOM., No. 19, Feb. 26, 2007, p. 1919, XP055295128, ISSN: 1359-7345, DOI: 10.1039/b700994a, pp. 1919-1921.
(Continued)

*Primary Examiner* — Alexandre F Ferre
(74) *Attorney, Agent, or Firm* — Blank Rome, LLP

(57) ABSTRACT

A composition of matter comprises a plurality of quantum dots and a metal thiol polymer that acts to stabilize the quantum dots. In certain embodiments, the metal thiol polymer is a zinc thiol polymer. The zinc thiol polymer may be a zinc alkanethiolate. The zinc alkanethiolate may be zinc dodecanethiolate (Zn-DDT). A composition comprising a plurality of quantum dots and a metal thiol polymer may be formulated with one or more additional polymers as a quantum dot-containing bead or as a quantum dot-containing composite material—e.g., a multilayer film.

22 Claims, 3 Drawing Sheets

(51) Int. Cl.
   *H01L 33/50* (2010.01)
   *C09K 11/70* (2006.01)
   *C08G 79/00* (2006.01)
   *B82Y 20/00* (2011.01)
   *B82Y 40/00* (2011.01)
(52) U.S. Cl.
   CPC .............. *H01L 33/56* (2013.01); *B82Y 20/00* (2013.01); *B82Y 40/00* (2013.01); *H01L 33/502* (2013.01); *H01L 2933/005* (2013.01); *H01L 2933/0033* (2013.01); *H01L 2933/0041* (2013.01); *Y10S 977/774* (2013.01); *Y10S 977/783* (2013.01); *Y10S 977/896* (2013.01); *Y10S 977/95* (2013.01)

(56) References Cited

U.S. PATENT DOCUMENTS

| | | | | |
|---|---|---|---|---|
| 2009/0068108 A1* | 3/2009 | Sokolov | ............... | A61B 5/0059 424/9.1 |
| 2011/0014473 A1* | 1/2011 | Ying | ........................ | B82Y 5/00 428/407 |
| 2011/0077172 A1* | 3/2011 | Aizenberg | .......... | B81C 1/00206 506/16 |
| 2011/0097879 A1 | 4/2011 | Reiss et al. | | |
| 2014/0264172 A1 | 9/2014 | Daniels et al. | | |
| 2014/0264193 A1 | 9/2014 | Daniels et al. | | |
| 2014/0264196 A1 | 9/2014 | Werner et al. | | |

OTHER PUBLICATIONS

Su Chen et al., Supporting Information for "Facile Fabrication of superhydrophobic surface from micro/nanostructure metal alkanethiolate based films", Supplementary Material (ESI) for Chemical Communications—CHEMCOM., No. 19, Feb. 26, 2007, p. 1919, XPO55295128, ISSN: 1359-7345, DOI: 10.1039/b700994a, pp. 1919-1921.

Steed, J. W. et al., "Core Concepts in Supramolecular Chemistry and Nanochemistry", Dec. 31, 2007, John Wiley & Sons, Hoboken, XP00276041, pp. 266-271.

International Search Report received in corresponding PCT application No. PCT/IB2016/000416, dated Sep. 23, 2016.

* cited by examiner

QUANTUM DOTS STABILIZED WITH A METAL THIOL POLYMER

CROSS-REFERENCE TO RELATED APPLICATIONS

This application claims the benefit of U.S. Provisional Application No. 62/128,354, filed on Mar. 4, 2015.

STATEMENT REGARDING FEDERALLY SPONSORED RESEARCH OR DEVELOPMENT

Not Applicable

BACKGROUND OF THE INVENTION

1. Field of the Invention

The present invention generally relates to semiconductor nanoparticles (or "quantum dots"). More particularly, it relates to the use of a metal thiol polymer (e.g., zinc 1-dodecanethiol polymer) to provide semiconductor nanoparticles with enhanced stability.

2. Description of the Related Art Including Information Disclosed Under 37 CFR 1.97 and 1.98.

There is widespread interest in exploiting the properties of compound semiconductors consisting of particles with dimensions on the order of 2-50 nm, often referred to as quantum dots (QDs) or nanocrystals. These materials are of commercial interest due to their size-tunable electronic properties which can be exploited in many commercial applications such as optical and electronic devices and other applications that range from biological labelling, photovoltaics, catalysis, biological imaging, LEDs, general space lighting and electro-luminescent displays among many other new and emerging applications.

The most studied of semiconductor materials have been the chalcogenides II-VI materials namely ZnS, ZnSe, CdS, CdSe, CdTe; most noticeably CdSe due to its tunability over the visible region of the spectrum. Reproducible methods for the large scale production of these materials have been developed from "bottom up" techniques, whereby particles are prepared atom-by-atom, i.e., from molecules to clusters to particles, using "wet" chemical procedures.

Two fundamental factors, both related to the size of the individual semiconductor nanoparticle, are responsible for their unique properties. The first is the large surface to volume ratio; as a particle becomes smaller, the ratio of the number of surface atoms to those in the interior increases. This leads to the surface properties playing an important role in the overall properties of the material. The second factor being that, with many materials including semiconductor nanoparticles, there is a change in the electronic properties of the material with size. Moreover, because of quantum confinement effects, the band gap gradually becomes larger as the size of the particle decreases. This effect is a consequence of the confinement of an "electron in a box" giving rise to discrete energy levels similar to those observed in atoms and molecules, rather than a continuous band as observed in the corresponding bulk semiconductor material. Thus, for a semiconductor nanoparticle, because of the physical parameters, the electron and hole, produced by the absorption of electromagnetic radiation (a photon, with energy greater than the first excitonic transition), are closer together than they would be in the corresponding macrocrystalline material, moreover the Coulombic interaction cannot be neglected. This leads to a narrow bandwidth emission, which is dependent upon the particle size and composition of the nanoparticle material. Thus, quantum dots have higher kinetic energy than the corresponding macrocrystalline material and consequently the first excitonic transition (band gap) increases in energy with decreasing particle diameter.

Core semiconductor nanoparticles, which consist of a single semiconductor material along with an outer organic passivating layer, tend to have relatively low quantum efficiencies due to electron-hole recombination occurring at defects and dangling bonds situated on the nanoparticle surface which can lead to non-radiative electron-hole recombinations. One method to eliminate defects and dangling bonds on the inorganic surface of the quantum dot is to grow a second inorganic material, having a wider band-gap and small lattice mismatch to that of the core material epitaxially on the surface of the core particle, to produce a "core-shell" particle. Core-shell particles separate any carriers confined in the core from surface states that would otherwise act as non-radiative recombination centers. One example is a ZnS shell grown on the surface of a CdSe core. Another approach is to prepare a core-multi shell structure where the electron-hole pair is completely confined to a single shell layer consisting of a few monolayers of a specific material such as a quantum dot-quantum well structure. Here, the core is of a wide band gap material, followed by a thin shell of narrower band gap material, and capped with a further wide band gap layer, such as CdS/HgS/CdS grown using substitution of Hg for Cd on the surface of the core nanocrystal to deposit just a few monolayers of HgS which is then over grown by a monolayer of CdS. The resulting structures exhibit clear confinement of photo-excited carriers in the HgS layer. To add further stability to quantum dots and help to confine the electron-hole pair one of the most common approaches is by epitaxially growing a compositionally graded alloy layer on the core; this can help to alleviate strain that could otherwise led to defects. Moreover, for a CdSe core, in order to improve structural stability and quantum yield, a graded alloy layer of $Cd_{1-x}Zn_xSe_{1-y}S_y$ can be used rather than growing a shell of ZnS directly on the core. This has been found to greatly enhance the photoluminescence emission of the quantum dots.

Doping quantum dots with atomic impurities is an efficient way also of manipulating the emission and absorption properties of the nanoparticle. Procedures for doping of wide band gap materials, such as zinc selenide and zinc sulfide, with manganese and copper (ZnSe:Mn or ZnS:Cu), have been developed. Doping with different luminescence activators in a semiconducting nanocrystal can tune the photoluminescence and electroluminescence at energies even lower than the band gap of the bulk material whereas the quantum size effect can tune the excitation energy with the size of the quantum dots without having a significant change in the energy of the activator-related emission.

The widespread exploitation of quantum dot nanoparticles has been restricted by their physical/chemical instability and incompatibility with many of the materials and/or processes required to exploit the quantum dots to their full potential, such as incorporation into solvents, inks, polymers, glasses, metals, electronic materials, electronic devices, bio-molecules and cells. Consequently, a series of quantum dot surface modification procedures has been employed to render the quantum dots more stable and compatible with the materials and/or processing requirements of a desired application.

A particularly attractive field of application for quantum dots is in the development of next generation light-emitting diodes (LEDs). LEDs are becoming increasingly important in modern-day life and it is envisaged that they have the potential to become one of the major applications for quantum dots, for example, in automobile lighting, traffic signals, general lighting, and backlight units (BLUs) for liquid crystal display (LCD) screens. LED-backlit LCDs are not self-illuminating (unlike pure-LED systems). There are several methods of backlighting an LCD panel using LEDs, including the use of either white or RGB (Red, Green, and Blue) LED arrays behind the panel and edge-LED lighting (which uses white LEDs around the inside frame of the TV and a light-diffusion panel to spread the light evenly behind the LCD panel). Variations in LED backlighting offer different benefits. LED backlighting using "white" LEDs produces a broader spectrum source feeding the individual LCD panel filters (similar to cold cathode fluorescent (CCFL) sources), resulting in a more limited display gamut than RGB LEDs at lower cost. Edge-LED lighting for LCDs allows a thinner housing and LED-backlit LCDs have longer life and better energy efficiency than plasma and CCFL televisions. Unlike CCFL backlights, LEDs use no mercury (an environmental pollutant) in their manufacture. Because LEDs can be switched on and off more quickly than CCFLs and can offer a higher light output, it is possible to achieve very high contrast ratios. They can produce deep blacks (LEDs off) and high brightness (LEDs on).

Currently, LED devices are made from inorganic solid-state compound semiconductors, such as AlGaAs (red), AlGaInP (orange-yellow-green), and AlGaInN (green-blue). However, using a mixture of the available solid-state compound semiconductors, solid-state LEDs which emit white light cannot be produced. Moreover, it is difficult to produce "pure" colors by mixing solid-state LEDs of different frequencies. Therefore, currently the main method of color mixing to produce a required color, including white, is to use a combination of phosphorescent materials which are placed on top of the solid-state LED whereby the light from the LED (the "primary light") is absorbed by the phosphorescent material and then re-emitted at a different wavelength (the "secondary light"), i.e., the phosphorescent materials down-convert the primary light to the secondary light. Moreover, the use of white LEDs produced by phosphor down-conversion leads to lower costs and simpler device fabrication than a combination of solid-state red-green-blue LEDs.

Current phosphorescent materials used in down-converting applications absorb UV or mainly blue light and convert it to longer wavelengths, with most phosphors currently using trivalent rare-earth doped oxides or halophosphates. White emission can be obtained by blending phosphors which emit in the blue, green and red regions with that of a blue or UV-emitting solid-state device. i.e., a blue-light-emitting LED plus a green phosphor such as, $SrGa_2S_4:Eu^{2+}$, and a red phosphor such as, $SrSi:Eu^{2+}$ or a UV-light-emitting LED plus a yellow phosphor such as, $Sr_2P_2O_7:Eu^{2+}; Mn^{2+}$, and a blue-green phosphor. White LEDs can also be made by combining a blue LED with a yellow phosphor, however, color control and color rendering is poor when using this methodology due to lack of tunability of the LEDs and the phosphor. Moreover, conventional LED phosphor technology uses down-converting materials that have poor color rendering (i.e., color rendering index (CRI)<75).

Rudimentary quantum dot-based light-emitting devices have been made by embedding colloidally produced quantum dots in an optically clear (or sufficiently transparent) LED encapsulation medium, typically a silicone or an acrylate, which is then placed on top of a solid-state LED. The use of quantum dots potentially has some significant advantages over the use of the more conventional phosphors, such as the ability to tune the emission wavelength, strong absorption properties and low scattering if the quantum dots are mono-dispersed.

For the commercial application of quantum dots in next-generation light-emitting devices, the quantum dots may be incorporated into the LED encapsulating material while remaining as fully mono-dispersed as possible and without significant loss of quantum efficiency. The methods developed to date are problematic, not least because of the nature of current LED encapsulants. Quantum dots can agglomerate when formulated into current LED encapsulants, thereby reducing the optical performance of the quantum dots. Moreover, even after the quantum dots have been incorporated into the LED encapsulant, oxygen can still migrate through the encapsulant to reach the surfaces of the quantum dots, which can lead to photo-oxidation and, as a result, a drop in quantum yield (QY).

Quantum dots (QDs) may be incorporated into polymer beads for a variety of reasons. Labeled beads are disclosed in U.S. Pat. Nos. 7,674,844 and 7,544,725. Multi-layer-coated quantum dot beads are described in U.S. Pub. No. 2014/0264196 and the preparation of quantum dot beads having a silyl surface shell is described in U.S. Pub. No. 2014/0264193. Quantum dot polymer beads have also been developed for lighting and display applications. The incorporation of quantum dots into beads offers benefits in terms of processing, protecting quantum dots from photo oxidation, and ease of color rendering. However, one detrimental effect of incorporating quantum dots into beads is that the quantum yield of the quantum dots is often reduced.

Traditionally, the QD beads have been prepared via suspension polymerisation by mixing the QDs with (meth) acrylate resins containing lauryl methacrylate (LMA) as a monomer, trimethyloyl propane trimethacrylate (TMPTM) as a cross-linker and phenylbis(2,4,6 trimethyl benzoyl) phosphine oxide (IRGACURE® 819) as a photoinitiator, and curing using UV-LED light. Although bright QD beads have been successfully synthesized by suspension polymerisation, due to the large resulting bead size, those beads are not suitable to use in many applications—e.g. lighting and display applications. The synthesis of small beads in the size range below 50 microns is very challenging and a drop in the photoluminescence quantum yield (QY) is usually observed with decreasing bead size.

Recently, a facile method for making both red and green, small (<50 μm), bright, QD beads for lighting and display applications has been developed. The process involves the addition of TWEEN® polysorbate surfactant [ICI Americas, Inc.] together with an aqueous polyvinyl alcohol (PVOH) solution, leading to the formation of smaller, brighter beads.

The method has been extended to include the use of SPAN® surfactants [Croda International PLC], a series of polysorbitan ester surfactants, in the place of the TWEEN® surfactants.

In such a suspension polymerization, a solution comprised of unwashed monomer (e.g., lauryl methacrylate), a cross-linker (e.g., trimethyloyl propane methacrylate) and a photoinitiator (e.g. IRGACURE 819) may be added to dry quantum dots to produce a QD-resin solution. An aqueous solution of PVOH and a surfactant (e.g., TWEEN 80) may be stirred at about 400-1000 rpm and the QD-resin solution injected under a nitrogen atmosphere. Optionally, the surfactant may be added to the QD-resin solution. The solution may be allowed to equilibrate and then cured by exposure to UV light. The resulting small QD polymer beads may be recovered by washing with cold water and acetonitrile and drying under vacuum.

Both red-emitting and green-emitting QD beads have been successfully synthesized by suspension polymerization, but the quantum yield (QY) of red beads in particular has heretofore been below that required for most display applications. Conventional quantum dot polymer beads are also sensitive to heat, i.e., the quantum yield of the quantum dots is significantly reduced after the beads have been heated. This imposes limitations for post-processing of the beads, e.g. atomic layer deposition (ALD) coating, and may limit their processing into devices, e.g. soldering of an LED containing fluorescent beads onto a circuit board.

In view of the significant potential for the application of quantum dots across such a wide range of applications, including but not limited to, quantum dot-based light-emitting devices such as display backlight units (BLUs), work has already been undertaken by various groups in an effort to develop methods for increasing the stability of quantum dots so as to make them brighter, more long-lived, and/or less sensitive to various types of processing conditions. For example, reasonably efficient quantum dot-based light-emitting devices can be fabricated under laboratory conditions building on current published methods. However, there remain significant challenges to the development of quantum dot-based materials and methods for fabricating quantum dot-based devices, such as light-emitting devices, on an economically viable scale and which provide sufficiently high levels of performance to satisfy consumer demand.

BRIEF SUMMARY OF THE INVENTION

It has been discovered that the addition of a metal thiol coordination polymer into quantum dot beads and composites has at least two, distinct benefits: 1) it significantly increases the QY in comparison to beads and composites synthesized without a metal thiol polymer; and, 2) beads and composites made with the inclusion of a metal thiol polymer are more thermally stable, i.e. they retain a higher proportion of their initial QY after being heated.

The present invention comprises a method to prepare heavy-metal-free quantum dot beads and composites using an organometallic zinc sulfide polymer such as a Zn-DDT (1-dodecanethiol) polymer either as an additive in an otherwise conventional synthesis method or using a metal thiol polymer as the polymer matrix of the bead or composite.

Previous attempts to make small QD beads by the above-described method without the Zn-DDT polymer resulted in beads with substantially lower brightness than beads synthesized with Zn-DDT polymer.

The method of the present invention makes highly bright QD beads and composites that retain a greater portion of their QY after being heated. These attributes make a substantial impact on improving the performance of the QD polymer beads and composites.

Low cross-linked, highly bright beads and composites are suitable for making films for display applications. Higher cross-linked bright beads are suitable for ALD-coating, for example, with a metal oxide surface coating such as $Al_2O_3$, to lower the water vapor transmission rate and the permeability to other gases and liquids. Such coated beads may also be suitable for display and lighting applications.

Because the addition of certain types of Zn-DDT (depending on the particular synthesis route used) into beads and composites reduces the full width at half maximum (FWHM) of the peak in the emission spectrum and reduces the amount of red shift that is typically observed when quantum dots are incorporated into a matrix, improved color rendering may result.

Quantum dots with a thin or incomplete inorganic shell or quantum dots with very high purity (and therefore lacking a large excess of stabilizing ligands) show an unacceptable loss of photoluminescence quantum yield when handled. This has been a significant impediment to their incorporation into applications such as use as a color conversion material in display and lighting applications.

Quantum dot-containing composites also benefit from the addition of a metal-thiol polymer. For example, a two-phase resin system to produce quantum dot films for display applications using a liquid-liquid system of an epoxy outer phase with an acrylate inner phase that are cured to provide a solid-solid final film exhibited enhanced stability and performance when a Zn-dodecanethiol polymer was used as a host material for the quantum dots in the inner phase of the two-phase resin system.

Various quantum dot-(metal-thiol polymer) composite materials according to the invention have been developed and combined with various outer phase type resins and the performance and lifetimes in films evaluated. The use of the metal-thiol polymer as the host material has proved beneficial for maintaining external quantum efficiency of the film, as well as edge ingress stability under light stress and dark ingress stability under thermal stress.

It is to be understood that other aspects of the teachings will become readily apparent to those skilled in the art from the following description, wherein various embodiments are shown and described by way of illustration.

BRIEF DESCRIPTION OF THE SEVERAL VIEWS OF THE DRAWING(S)

DETAILED DESCRIPTION OF THE INVENTION

Figure 1:
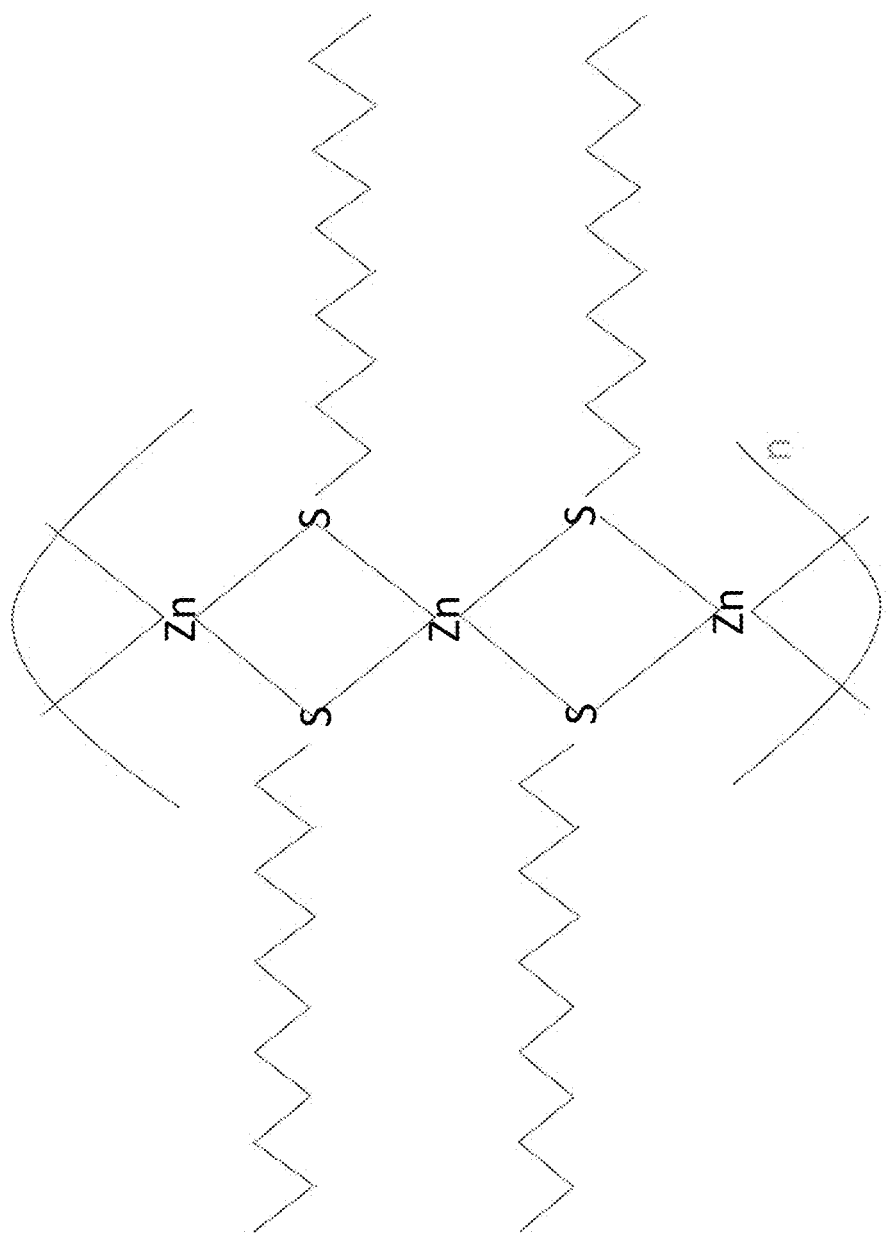
FIG. 1 is a contemplated structure of one particular zinc thiol polymer.

As discussed above, quantum dots with a thin or incomplete inorganic shell or quantum dots with sufficiently high purity (those lacking a sufficiently large excess of stabilizing ligands) exhibit an unacceptable loss of luminescence intensity over time when photo-excited. This has been a significant obstacle to their incorporation into commercial applications such as use as a color conversion material in display and lighting applications.

It has been discovered that the addition of a zinc thiol polymer to quantum dot-containing beads or a composite materials unexpectedly increases the QY of the quantum dot beads or composite in comparison to quantum dots or composites synthesized without a metal thiol polymer. Moreover, quantum dot composites made with the inclusion of a metal thiol polymer are more thermally stable.

A zinc thiol polymer is relatively easy to make and incorporate into quantum dots. One particular method of the prior art is described by Su Chen, Chunhui Hu, Li Chen and Nanping Xu, in *Chem. Commun.*, 2007, 1919-1921.

Very little or no loss in the solution quantum dot quantum yield (QY) was observed when a zinc thiol polymer was included in the preparation of quantum dot beads and composites. Incorporation of the polymer additive into the QD-containing resin helps to stabilize the photo-luminescence (PL) QY—i.e., there was less loss of PL QY in beads and composites having a metal thiol polymer incorporated therein.

The present invention involves the enhancement of quantum dot stability to environmental factors and processing conditions by inclusion into quantum dot-(metal-thiol polymer) beads and composite materials and the subsequent use of stabilized quantum dots in efficient and stable color down-conversion applications.

The stability enhancement of Zn-dodecanethiol polymer on quantum dots suggested that, if that polymer were used as a host material for the quantum dots in the inner phase of a two-phase resin system, a beneficial improvement in stability and performance could be realized.

A quantum dot-(metal-thiol polymer) composite material was developed and combined with various outer phase type resins and the performance and lifetimes of the quantum dots in films evaluated. The use of the metal-thiol polymer as the host material proved beneficial for maintaining external quantum efficiency (EQE) of the film, as well as edge ingress stability under light stress and dark ingress stability under thermal stress.

The present invention also has application in the use of metal-thiol coordination polymers as hosts for quantum dots to improve the maintenance of the quantum yield (QY) of the quantum dots during processing into an application format, in an exemplary case (but not limited to) a film made from an aggressive polar polymer which would ordinarily be expected to degrade quantum dot performance.

Zn-DDT polymer may be synthesized by a variety of techniques and different alkane chain lengths of the ligands may be used. However, each synthesis path produces material that has varying properties. The synthesis pathway that produces the most useful material known as of the filing date hereof is as described below. Ratios of each precursor may be varied to produce polymer with different properties:

Anhydrous zinc acetate was degassed at 100° C. in THERMINOL® 66 [SOLUTIA INC., 575 MARYVILLE CENTRE DRIVE, ST. LOUIS, MISSOURI 63141], a synthetic heat transfer fluid comprising a modified terphenyl, for 1 hr. The solution was placed under an inert $N_2$ atmosphere and raised to a temperature of 230° C. and annealed for 1 hr. After one hour, dodecanethiol was added in an amount relative to the amount of anhydrous zinc acetate used (Zn-to-S ratio of 1:0.9). The solution was left to anneal for one hour and was then cooled to 70° C. The solution was precipitated at 70° C. with a volume of acetone equal to the amount of THERMINOL 66 used.

The Zn-DDT polymer precipitated out as a thick, waxy dilatant. This material showed shear thickening properties reminiscent of corn starch in water. The produced material was washed with acetone and then dissolved into toluene at 90° C. for 30 minutes. The toluene solution produced was colorless and did not precipitate upon cooling to room temperature. Not all of the material was soluble in toluene. The insoluble material was then dried using a vacuum and subsequently ground into a fine powder.

For the material that was soluble in toluene, the toluene solution was precipitated with two volume equivalents of acetone. The precipitated material was then centrifuged and sonicated in acetone in order to remove toluene. Toluene seemed to have an affinity to this material. The precipitate was then dissolved into cyclohexane and re-precipitated with acetone. This final precipitate was then dried under vacuum and ground using a pestle and mortar. The drying and crushing process was repeated three times, producing a free-flowing, white solid.

Both the insoluble and soluble part were analyzed and tested in beads. In general, the insoluble fraction contains crystalline material and dispenses well in conventional bead resins (e.g., LMA/TMPTM). The soluble Zn-DDT fraction may be useful in other applications which are not detailed here.

An alternative synthetic pathway, using the precursor zinc dimethacrylate was developed to change the functionality of the Zn(DDT) polymer:

Anhydrous zinc dimethacrylate was degassed at 100° C. in THERMINOL 66 for 1 hr. The solution was then placed under an inert atmosphere ($N_2$) and the temperature was raised to 230° C. and annealed for 1 hr. After 1 hour, dodecanethiol was added relative to the amount of anhydrous zinc acetate used (Zn-to-S ratio of 1:0.9). The solution was left to anneal for 1 hr. and was then cooled to 70° C.

The solution was precipitated at 70° C. with a volume of acetone equal to the amount of THERMINOL 66 used. This produced a very fine precipitate which was completely insoluble in any solvent previously mentioned. The precipitate was further washed with acetone to purify the end product. The washed solid was then dried under vacuum for 24 hrs. to produce a very fine, free-flowing, off-white powder.

It is contemplated that other alkanethiols including functionalized alkanethiols may have application in the present invention. For example, the DDT may have a reactive functional group on the end of the alkane chain opposite the thiol group (or, in the case of branched alkanes, at a position remote from the thiol group) which reactive functional group allows cross linking or bonding into the polymer host itself.

The application of the present invention is illustrated below in two exemplars—QD beads, and QD-containing composite materials:

Quantum Dot Beads

Figure 2:
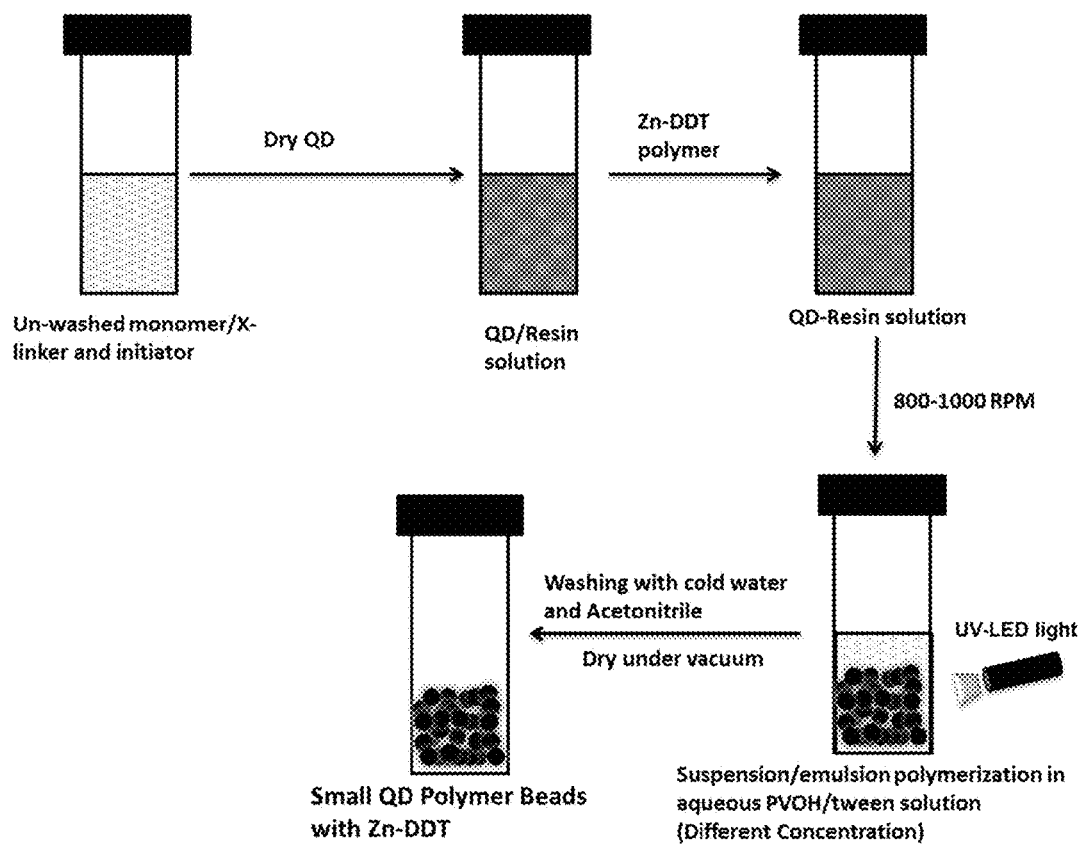
FIG. 2 is a schematic diagram of the synthesis of small QD beads with Zn-DDT by a suspension/emulsion polymerization according to the invention.

The synthetic procedure of making QD beads by suspension polymerization is illustrated schematically in FIG. 2.

Example 1: Preparation of Low Cross-Linked Small, Bright Red Beads Using Zn-DDT Polymer Preparation of PVOH Solution: Aqueous polyvinyl alcohol (PVOH) solution was prepared by dissolving PVOH in deionized water and stirring overnight. Prior to bead synthesis, the PVOH solution was filtered to remove any undissolved PVOH or dust particles. 1% TWEEN® 80 surfactant [CRODA AMERICAS LLC, 1209 ORANGE STREET, WILMINGTON DELAWARE 19801] was added to the 4% aqueous PVOH solution.

Preparation of Zn-DDT Resin Solution: To prepare the resin, red InPZnS-based alloyed quantum dots (13 mg/3 mL of resin) [PLmax=627 nm, FWHM=56 nm, QY (dilute, toluene)=80%] dissolved in toluene were transferred to an amber glass vial containing a stirrer bar, under an inert atmosphere. The toluene was removed under reduced pressure and continuous stirring. Once all visible traces of solvent were removed, the residue was heated to 40° C., for 45 minutes, under vacuum to remove any residual solvent. A stock solution was prepared by adding degassed lauryl methacrylate (LMA, 5.2 mL) and trimethyloyl propane methacrylate cross-linker (TMPTM, 0.8 mL) to the photoinitiator mixture IRGACURE® 819 initiator (40 mg, 0.74 wt. %) and IRGACURE 651 (40 mg, 0.74%) [BASF SE COMPANY, CARL-BOSCH-STR. 38 LUDWIGSHAFEN GERMANY 67056]. The mixture was stirred in the dark to ensure complete dissolution. The required amount of the stock solution was then added to the dry QD residue, under an inert atmosphere and dark conditions, to form a resin solution. The resin solution was stirred overnight to ensure complete dispersion of the QDs. The next day, the required amount of Zn-DDT powder was degassed for 1 hr. then the QD resin solution was added into it and stirred overnight.

Preparation of QD Beads with Zn-DDT: In a 20 mL glass vial, PVOH/Tween80 solution (4/1 wt. %, 10 mL) was degassed for a few hours under a vacuum/nitrogen cycle. For each experiment, 1 g resin solution was injected into an aqueous solution of PVOH/Tween80, under continuous stirring at 800 rpm, under $N_2$. The solution was allowed to equilibrate for 15 minutes, then cured for 10 minutes under a UV LED kit to form QD beads. The QD beads were subsequently washed with water and acetonitrile, then dried under vacuum. Characterization data is presented in Table 1, along with the QY after heating in vacuum for over 48 hrs.

TABLE 1

Low cross linked beads, 1/0.154 LMA/TMPTM, as typically used in bead films.

| Sample ID | Zn-DDT Concentration % | QY % | PL | FWHM | QY % after heating at 80° C. |
|---|---|---|---|---|---|
| B361 | 0 | 48 | 639 | 58 | 27 |
| B362 | 2.5 | 60 | 640 | 55 | n/a |
| B363 | 5 | 62 | 639 | 53 | 45 |
| B364 | 7.5 | 67 | 637 | 54 | n/a |
| B365 | 10 | 69 | 634 | 53 | 58 |
| B380 | 12.5 | 74 | 636 | 54 | n/a |
| B381 | 15 | 73 | 637 | 54 | 58 |

The data in Table 1 illustrates that the QY of the beads increased with increasing the Zn-DDT concentration. Additionally, the FWHM was reduced and the amount of red shift of the dots in the beads was reduced. The data in Table 1 also illustrates that beads made with more than about 10% of Zn-DDT polymer retain a significantly higher proportion of the initial QY on heating.

Figure 3A:
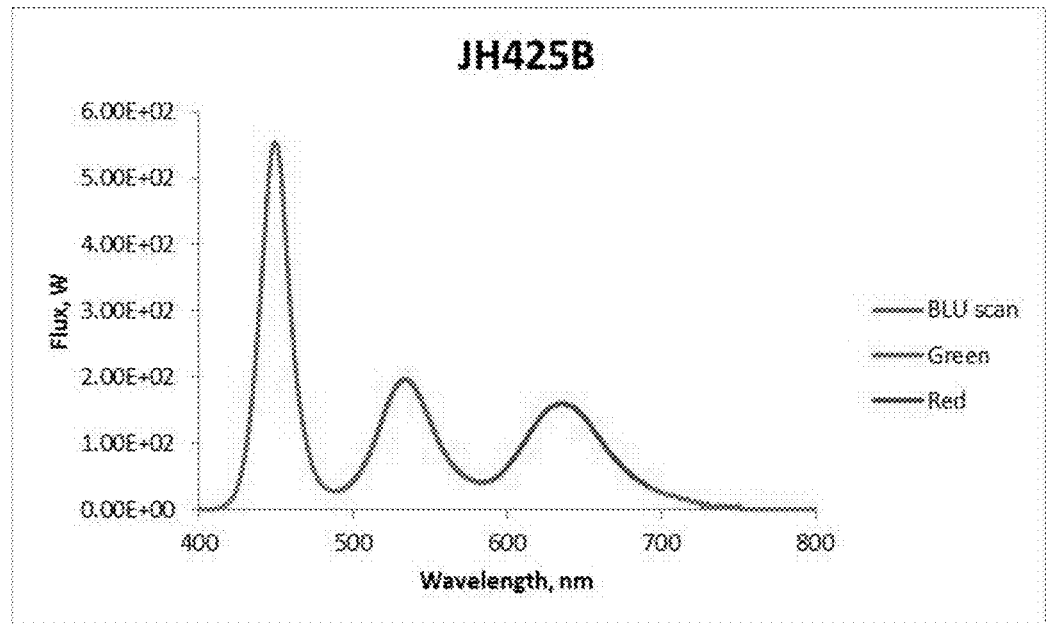
FIG. 3A shows the backlight unit (BLU) spectrum and FIG. 3B the resulting color gamut simulation for a particular film according to the invention.
Figure 3B:
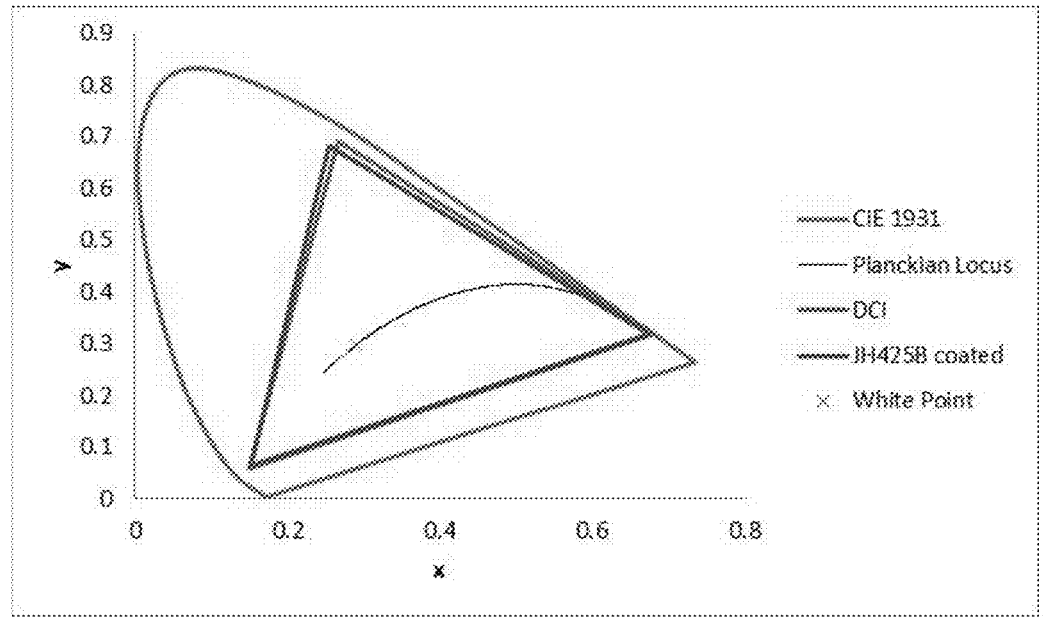

As shown in FIG. 3, the incorporation of Zn-DDT polymer into beads occurs as beads with higher Zn-DDT loading (sample IDs B364-365) settled on the bottom of the vial. Whereas beads with no or less Zn-DDT float (sample IDs B361 and B362). Interestingly, it has been found that beads with 5% Zn-DDT will make a stable colloidal latex solution.

Example 2: Preparation of Higher Cross-Linked Bright Red Beads Using Zn-DDT Polymer A similar procedure to Example 1 was followed, except using TWEEN® 80 surfactant (3 wt. %) [CRODA AMERICAS LLC, 1209 ORANGE STREET, WILMINGTON DELAWARE 19801], a 1:0.5 ratio of LMA:TMPTM and 1 wt. % of IRGACURE 819 for the resin solution preparation. 3 mL of the Zn-DDT QD resin solution was injected into a deoxygenated PVOH solution in a 250 mL tornado reaction vessel. The equilibrium time was 5 minutes and the curing time 10 minutes at 800 RPM. The characterization data is shown in Table Y.

TABLE 2

Details of higher cross-linked beads before and after ALD coating with $Al_2O_3$.

| Bead ID | Initial QY (%) | Zn-DDT concentration (%) | QY after ALD (%) | After:before ratio |
|---|---|---|---|---|
| B199 | 41 | 0 | 15 | 0.37 |
| B200 | 55 | 10 | 44 | 0.80 |
| B201 | 62 | 20 | 56 | 0.90 |

The data in Table 2 demonstrates that the QY of higher cross-linked beads has increased by increasing the Zn-DDT concentration. Table 2 also illustrates that the QY of the beads with 20% Zn-DDT retained about 90% of the initial QY after ALD coating with $Al_2O_3$. For the beads with no Zn-DDT only 37% of the initial QY was retained after ALD coating.

QD-Containing Composite Materials

Preparation of a quantum dot-(metal-thiol polymer) composite material may be achieved by mixing the two components, quantum dots and metal-thiol polymer, as toluene solutions followed by removal of the toluene by vacuum distillation. Additionally, a scattering agent (to aid blue light absorption and light extraction) may be added. An example of the preparation of a composite using Zn-dodecanethiol polymer is given in Example 3. In this case, the metal-thiol polymer used was Zn-dodecanethiol polymer which was prepared following a literature method (S. Chen, C. Hu, L. Chen and N. Xu, Chem. Commun., 2007, 1919). Post preparation, the photo-luminescent (PL) optical properties of the ground powders were investigated by fluorescence spectroscopy using a Hamamatsu spectrometer equipped with an integrating sphere accessory. The PL peak wavelength, full width at half maximum (FWHM) of the emission peak and the photo-luminescent quantum yield (PLQY) were determined using an excitation wavelength of 450 nm. Example data is presented in Table 3.

The PLQY performance of the ground composite powders compares favorably to other solid forms such as polymerized beads for, example, where PLQY measurements are usually lower than 70% due to damage induced by the action of the free radical polymerization and the aggressive outer-phase material needed during the bead synthesis.

TABLE 3

Example photo-luminescent PL, FWHM and PLQY data for quantum dot-(metal-thiol polymer) composite material samples.

| | Dilute Toluene QD Specs | | | QD Loading | QD Composite Material PLQY Measurements | | | |
|---|---|---|---|---|---|---|---|---|
| Sample | PL | FWHM | PLQY | (mg/g polymer) | PL | FWHM | PLQY | % Abs |
| 1101+ (<35 µm) | 528 | 45 | 77 | 35 | 535 | 45 | 74 | 20% |
| 1129 (>35 µm) | 522 | 45 | 80 | 35 | 529 | 44 | 71 | 21% |
| 1116 (>35 µm) | 524 | 44 | 79 | 35 | 533 | 43 | 68 | 22% |
| 1116 (<35 µm) | 524 | 44 | 79 | 35 | 528 | 45 | 72 | 25% |

TABLE 3-continued

Example photo-luminescent PL, FWHM and PLQY data for quantum dot-(metal-thiol polymer) composite material samples.

| Sample | Dilute Toluene QD Specs | | | QD Loading | QD Composite Material PLQY Measurements | | | |
|---|---|---|---|---|---|---|---|---|
| | PL | FWHM | PLQY | (mg/g polymer) | PL | FWHM | PLQY | % Abs |
| 1101+ (>35 μm) | 528 | 45 | 77 | 35 | 536 | 44 | 74 | 20% |
| 1129 (<35 μm) | 522 | 45 | 80 | 35 | 527 | 47 | 74 | 17% |
| 1130 (<35 μm) | 634 | 53 | 83 | 8 | 642 | 57 | 85 | 19% |
| 258A (<35 μm) | 631 | 51 | 78 | 8 | 635 | 55 | 68 | 19% |
| 1130 (>35 μm) | 634 | 53 | 83 | 14 | 642 | 57 | 78 | 18% |
| 1182 (<35 μm) | 525 | 43 | 78 | 35 | 530 | 44 | 63 | 11% |
| 1183 (<35 μm) | 628 | 52 | 81 | 14 | 631 | 53 | 78 | 11% |

To test the utility of these powders, a number of LEDs were prepared using small, low-power LEDs in a standard SMD 3528 package. The method of preparation for these is detailed in Example 4. After preparation, the external quantum efficiency (EQE) of the composites in the LEDs was determined by comparison with blank LEDs (i.e., LEDs without QDs) prepared using the same Optocast 3553 UV-cure epoxy resin without any composite material present and operating at a forward current of 20 mA. Given the very high absorbances of the composites in the LED, the EQEs are quite good and much better than could be achieved with dots dispersed directly into Optocast UV and/or heat-cured epoxy alone wherein they undergo significant quenching due to the negative interaction with the polar epoxy.

TABLE 4

Example photo-luminescent PL, FWHM and PLQY data for quantum dot-(metal-thiol polymer) composite material samples incorporated into low-power, SMD 3528, LEDs.

| Sample ID | Dilute Toluene QD Specs | | | QD Loading | Cured Optocast LEDs | | | |
|---|---|---|---|---|---|---|---|---|
| | PL | FWHM | PLQY | (mg/g polymer) | PL | FWHM | EQE | % Abs |
| 1101+ (<35 μm) | 528 | 45 | 77 | 35 | 544 | 42 | 43 | 84% |
| 1129 (>35 μm) | 522 | 45 | 80 | 35 | 541 | 40 | 55 | 81% |
| 1116 (>35 μm) | 524 | 44 | 79 | 35 | 540 | 42 | 59 | 70% |
| 1116 (<35 μm) | 524 | 44 | 79 | 35 | 536 | 42 | 54 | 64% |
| 1101+ (>35 μm) | 528 | 45 | 77 | 35 | 542 | 42 | 50 | 75% |
| 1129 (<35 μm) | 522 | 45 | 80 | 35 | 538 | 41 | 48 | 79% |
| 1130 (<35 μm) | 634 | 53 | 83 | 8 | 646 | 56 | 41 | 72% |
| 258A (<35 μm) | 631 | 51 | 78 | 8 | 641 | 54 | 32 | 78% |
| 1130 (>35 μm) | 634 | 53 | 83 | 14 | 644 | 56 | 57 | 60% |
| 1182 (<35 μm) | 525 | 43 | 78 | 35 | 538 | 40 | 57 | 73% |
| 1183 (<35 μm) | 628 | 52 | 81 | 14 | 635 | 54 | 65 | 47% |

To further test the utility of the prepared composite powders, they were dispersed into various polar resins and luminescent films were prepared by sandwiching the resin between two pieces of barrier film and curing the resin by UV light exposure. An example of the preparation of the resin mixture and subsequent film preparation is presented in Example 5. Following preparation, the films were cut into pieces approximately 14×18 mm for EQE and lifetime stress test measurements. A number of polar resins were investigated and the composite materials yielded films with relatively high EQEs in nearly all cases. Details of resins and amounts of composite materials along with film EQEs are presented in Table 5. Across a range of samples and resins, the lowest EQE achieved was 41% with most resins yielding films with EQEs of 49%.

TABLE 5

Composite-resin formulation details and resulting film EQEs.

| Film Code | Mass Green QDs, mg | Mass Red QDs, mg | Mass BaSO4 | Resin | Mass Resin, mg | EQE |
|---|---|---|---|---|---|---|
| 403B | 100 | 60 | 65 | Epotek OG142 | 740 | 48% |
| 404 | 100 | 60 | 65 | Epotek OG142 | 500 | 48% |
| 407A | 100 | 60 | 65 | Custom acrylate 1 | 500 | 49% |
| 407B | 100 | 60 | 65 | Custom acrylate 1 | 500 | 49% |
| 411A | 110 | 41 | 65 | Custom acrylate 1 | 500 | 49% |
| 411B | 110 | 41 | 65 | Custom acrylate 2 | 500 | 41% |
| 412D | 110 | 52 | 65 | Custom acrylate 2/Custom acrylate 1 (75/25 mix) | 500 | 47% |
| 416A | 110 | 52 | 65 | Custom acrylate 3 | 600 | 45% |

TABLE 5-continued

Composite-resin formulation details and resulting film EQEs.

| Film Code | Mass Green QDs, mg | Mass Red QDs, mg | Mass BaSO$_4$ | Resin | Mass Resin, mg | EQE |
|---|---|---|---|---|---|---|
| 416B | 110 | 52 | 65 | Custom acrylate 4 | 600 | 50% |
| 416C | 110 | 52 | 65 | Optocast 3553 | 600 | 46% |
| 418A | 172 | 98 | 73 | Custom acrylate 3 | 1600 | 52% |
| 425A | 520 | 300 | 0 | Custom acrylate 5 | 2400 | 47% |
| 425B | 541 | 315 | 0 | Custom acrylate 5 | 2400 | 48% |
| 425C | 568 | 340 | 0 | Custom acrylate 5 | 2400 | 49% |

Some of the resins used were commercially available. However, some were prepared as custom formulations. The different resin formulations can generally be described as:

custom acrylate 1: Epoxy acrylate resin with bi-functional monomer custom acrylate 2: Low glass transition temperature ($T_g$) acrylate resin custom acrylate 3: Epoxy acrylate resin with bi-functional monomer custom acrylate 4: High $T_g$ acrylate resin custom acrylate 5: Epoxy acrylate resin with bi-functional monomer Further illustration of the impact of the quantum dot-(metal-thiol polymer) composite material on performance maintenance can be seen in Table where it is clear that the EQEs of films using a solid QD-(metal-thiol polymer) composite is much improved compared to those using a QD in a liquid monomer inner phase. In particular, custom acrylate 2, which produces a low $T_g$ acrylate, is clearly damaging to the liquid monomer inner-phase performance producing a low EQE of 13% compared to around 40% when a more benign resin (like custom acrylate 1) is used. This is most likely due to the metal-thiol polymers ability to form super hydrophobic structures [S. Chen, C. Hu, L. Chen and N. Xu, Chem. Commun., 2007, 1919] which is very good at protecting the quantum dots from deleterious components in the outer phase resin.

TABLE 6

Comparison of film EQEs when dots are incorporated in metal thiol polymer composites or in a liquid monomer inner phase in the resin prior to curing.

| Inner Phase | Outer Phase | Film EQE |
|---|---|---|
| liquid LMA/TMPTM | Custom acrylate 2 | 13% |
| QD-(metal-thiol polymer) composite solid | Custom acrylate 2 | 41% |
| liquid LMA/TMPTM | Custom acrylate 1 | 38% |
| QD-(metal-thiol polymer) composite solid | Custom acrylate 1 | 49% |

Further evidence of how the metal-thiol polymer helps to protect the quantum dots is provided by heat-treating the samples. Table 7 shows PLQY measurements of samples before and after heat treatment and indicates that the composites maintain PLQY performance very well compared to other types of solids with embedded quantum dots, in this case, acrylate beads.

TABLE 7

Comparison of QY maintenance after heat treatment of acrylate beads and Zn-thiol polymer composite solids.

| Bead | Initial PLQY | PLQY after heat treatment | After:before ratio |
|---|---|---|---|
| B199 acrylate polymer beads | 41% | 15% | 0.37 |
| QD-Zn/DDT polymer composite | 79% | 73% | 0.92 |

To test the usability of the composites in liquid crystal display (LCD) BLUs as a color conversion material, the QD-(metal-thiol polymer) composite materials were dispersed into different resins and sandwich-type films were made wherein a QD-containing layer is sandwiched between two pieces of barrier film. Following fabrication, the films were tested on a blue BLU for performance in terms of luminance and white point and using liquid crystal module (LCM) transmission spectra for the red, green and blue pixels possible color gamut performance simulated. An example spectrum of a QD-(metal-thiol polymer) composite film and subsequent color gamut are reproduced in FIG. 3A and FIG. 3B, respectively. In the case of this sample film (425B), the luminance on a 550-nit BLU was 2280 nits and utilized a diffuser/BEF/DBEF optical film stack. The color gamut simulation was done using transmission spectra determined from a commercially available television receiver and, when applied to the BLU data, gave a large color gamut with overlap of 96% of the Digital Cinema Initiatives P3 (DCI-P3) standard. The BLU white point (x,y) was 0.267, 0.238 which gave a desired white point of 0.290, 0.296 after transmission spectra were applied.

Further to BLU performance data, the films were also cut into smaller pieces (approximately 19 mm×14 mm) and subjected to a number of different lifetime stress tests designed to test the maintenance of performance of the film under accelerated use conditions. In the real-world application the film would ordinarily be exposed to approximately 3-10 mW/cm$^2$ of blue light irradiance within the BLU. As such, the films were stress tested with irradiances and humidities of 2.4 mW/cm$^2$ at room temperature (real time test) and 106 mW/cm$^2$ at 60° C./90% relative humidity (accelerated test). Additionally, they were subjected to a dark test at 60° C./90% relative humidity (RH).

In all tests, the films maintained good performance, evidencing no degradation in performance in the real-time test over the course of 2500 hrs. of testing. At 60° C./90% RH conditions, the films also showed relatively good maintenance of performance, maintaining over 80% relative performance when exposed to 106 mW/cm$^2$ blue light stress and over 90% for green-emitting quantum dots and over 70% for red-emitting quantum dots when stressed in the dark. Importantly, in the dark test, there was no visual sign of edge ingress which has proven to be a problem in other systems.

Example 3: Preparation of Quantum Dot-(Metal-Thiol Polymer) Composite Material Two milliliters of a toluene solution of green-emitting quantum dots (heavy metal-free semiconductor nanoparticles) at a concentration of 35 mg/mL were added to 14 mL of glacial acetic acid. The resulting precipitate was isolated by centrifugation and the supernatant discarded. The solid collected was rinsed with acetonitrile and then dissolved in n-hexane and centrifuged. Any remaining undissolved solids were discarded and the hexane solution was transferred to a separating funnel. Acetonitrile (15 mL) was added and the funnel shaken. After phase separation, the polar layer was discarded. This extraction process was repeated twice more to yield a coating on the separating funnel glass and two colorless liquid phases, which were discarded. The coating was rinsed once more with acetonitrile. If the washings were acidic, the coating was rinsed again until the rinse solvent tested pH~neutral. Finally, the coating was dissolved in toluene (3 mL).

Separately, 1 g of Zn-dodecanethiol polymer was dissolved in toluene (10 mL) and mixed with 1 mL of the above prepared quantum dot solution. Barium sulfate powder (70 mg) was added and the mixture sonicated. The resulting suspension was evaporated to dryness in vacuo to yield a yellow solid that was placed under nitrogen. Traces of solvent were then removed using a freeze drying technique. The sample was cooled with liquid nitrogen, placed under reduced pressure for a several minutes, brought slowly back to room temperature (where it was left under reduced pressure for several minutes), then backfilled with a nitrogen atmosphere. The cycle was repeated at least 5 times until a free flowing solid was obtained. The sample was then transferred to an inert-atmosphere glove box where it was ground in an agate pestle and mortar and sieved through a 35-micron sieve to yield a free-flowing, highly luminescent powder.

Example 4: Preparation of Test LEDs

Ground and sieved QD-(Zn-dodecanethiol polymer)-$BaSO_4$ composite material (9 mg) was weighed into a clean glass vial. UV curing epoxy Optocast 3553 (120 μL) was added and the suspension thoroughly mixed. A small volume (3 μL) of the suspension was deposited into the empty well of a 3528 LED package and the resin cured by exposure to UV light (360 nm, 170 mW/cm$^2$, 64 seconds).

Example 5: Preparation of Luminescent Composite Films

Sample 1116 (172 mg), sample 1130 (98 mg) and $BaSO_4$ were weighed into a clean amber vial in an inert-atmosphere glove box. An epoxy-acrylate-based resin (800 mg) was added and the mixture mixed well with a clean metal spatula until an even-colored viscous mixture was obtained. The vial was then capped and removed from the glove box and, under yellow light, dispensed onto the barrier side of a PET-based barrier film with an oxygen transmission rate (OTR) of approximately $10^{-2}$ g/m$^2$/day. Another piece of barrier film was placed on the top of the resin with the barrier side towards the resin and the sandwich pulled through a mangle to spread the resin and define the film thickness. Following this step, the film was placed in a UV curing oven for 30 seconds where a dose of approximately 800 mJ was delivered and the film fully cured.

Advantages

The use of metal-thiol coordination polymers as hosts for quantum dots in composite materials has a number of advantages. First, there is a strong interaction between the polymer and the quantum dots such that the quantum dots are very stable when interacting with the polymer and the polymer shields the quantum dots from deleterious outside agents such as initiators and polar outer phase components. Second, the composite can be prepared as a solid so that subsequent color rendering of films is relatively straightforward and only involves the weighing of different powders followed by mixing with the outer phase resin. Third, different colored solid composites will not mix when mixed into the outer phase resin, keeping color rendering simple. Finally, because there is no curing step and the quantum dots are simply embedded in the host matrix there are no losses of performance resulting from damage to the quantum dots by curing.

The foregoing presents particular embodiments of a system embodying the principles of the invention. Those skilled in the art will be able to devise alternatives and variations which, even if not explicitly disclosed herein, embody those principles and are thus within the scope of the invention. Although particular embodiments of the present invention have been shown and described, they are not intended to limit what this patent covers. Those skilled in the art will understand that various changes and modifications may be made without departing from the scope of the present invention as literally and equivalently covered by the following claims.

What is claimed is:

1. A composition of matter comprising:
   a powder comprising a plurality of beads, wherein each bead comprises:
      a primary matrix material comprising Zn-DDT; and
      a population of quantum dot nanoparticles incorporated into the primary matrix material.

2. The composition recited in claim 1 wherein the primary matrix material contains at least about 10% by weight Zn-DDT.

3. The composition recited in claim 1 wherein the primary matrix material contains at least about 20% by weight Zn-DDT.

4. The composition recited in claim 1 further comprising:
   a surface coating disposed on each bead, the surface coating comprising at least one surface coating layer.

5. The composition recited in claim 4 wherein each surface coating layer consists essentially of one or more monolayers of a coating material.

6. The composition of claim 1, wherein the primary matrix material is silica, a resin, a polymer, a monolith, a glass, a sol-gel, an epoxy, a silicone, or a (meth)acrylate.

7. The composition of claim 4, wherein the surface coating is an inorganic material.

8. The composition of claim 4, wherein the surface coating is a metal oxide.

9. The composition of claim 4, wherein the surface coating is aluminum oxide or silicon oxide.

10. The composition of claim 4, wherein the surface coating is polymeric.

11. The composition of claim 4, wherein the surface coating is an alkoxide alloy polymer.

12. The composition of claim 1, wherein the quantum dot nanoparticles comprise indium and phosphorus.

13. The composition of claim 1, wherein the quantum dot nanoparticles are essentially free of cadmium.

14. The composition of claim 4, wherein the surface coating comprises two or more surface coating layers comprising different materials.

15. The composition of claim 1, wherein each bead comprises about 1000 to about 10,000 nanoparticles.

16. The composition of claim 1, wherein each bead comprises about 10,000 to about 100,000 quantum dot nanoparticles.

17. A composite material comprising:
quantum dots;
a resin comprising an epoxy acrylate resin with a bi-functional monomer; and
a metal-thiol polymer.

18. The composite material recited in claim 17 wherein the metal thiol polymer is a zinc thiol polymer.

19. The composite material recited in claim 18 wherein the zinc thiol polymer is a zinc alkanethiolate.

20. The composition recited in claim 19 wherein the zinc alkanethiolate is zinc dodecanethiolate (Zn-DDT).

21. A composite film comprising:
a first barrier layer;
a second barrier layer;
a layer of quantum dots embedded in a resin comprising a metal-thiol polymer disposed between the first barrier layer and the second barrier layer.

22. The composite film recited in claim 21 wherein the first barrier layer and the second barrier layer are substantially impermeable to oxygen and water vapor.

* * * * *